United States Patent
Mutch et al.

(10) Patent No.: US 11,018,229 B2
(45) Date of Patent: May 25, 2021

(54) METHODS OF FORMING SEMICONDUCTOR STRUCTURES

(71) Applicant: Micron Technology, Inc., Boise, ID (US)

(72) Inventors: Michael Mutch, Meridian, ID (US); Manuj Nahar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/121,928

(22) Filed: Sep. 5, 2018

(65) Prior Publication Data

US 2020/0075732 A1 Mar. 5, 2020

(51) Int. Cl.
| | |
|---|---|
| *H01L 29/161* | (2006.01) |
| *H01L 29/04* | (2006.01) |
| *H01L 29/786* | (2006.01) |
| *H01L 21/02* | (2006.01) |
| *C30B 25/18* | (2006.01) |
| *H01L 27/105* | (2006.01) |

(52) U.S. Cl.
CPC ............ *H01L 29/161* (2013.01); *C30B 25/18* (2013.01); *H01L 21/0262* (2013.01); *H01L 21/02532* (2013.01); *H01L 29/04* (2013.01); *H01L 29/78642* (2013.01); *H01L 27/105* (2013.01)

(58) Field of Classification Search
None
See application file for complete search history.

(56) References Cited

U.S. PATENT DOCUMENTS

| | | | |
|---|---|---|---|
| 3,966,513 A | 6/1976 | Philippe et al. |
| 4,767,585 A | 8/1988 | Holm et al. |
| 5,471,331 A | 11/1995 | Takizawa et al. |
| 5,543,187 A | 8/1996 | Errico |
| 5,612,230 A | 3/1997 | Yuzurihara et al. |
| 6,080,998 A | 6/2000 | Shima et al. |
| 6,737,307 B2 | 5/2004 | Tsai et al. |
| 6,974,763 B1 | 12/2005 | Zhang et al. |
| 7,029,995 B2 | 4/2006 | Todd et al. |
| 7,501,331 B2 | 3/2009 | Herner |
| 7,563,670 B2 | 7/2009 | Cheng et al. |
| 8,062,963 B1 | 11/2011 | van Dal |
| 9,252,191 B2 | 2/2016 | Clark et al. |
| 9,876,018 B2 | 1/2018 | Chavan et al. |

(Continued)

*Primary Examiner* — Long Pham
(74) *Attorney, Agent, or Firm* — TraskBritt (57) ABSTRACT

A method of forming a semiconductor structure includes forming a first material over a base material by vapor phase epitaxy. The first material has a crystalline portion and an amorphous portion. The amorphous portion of the first material is removed by abrasive planarization. At least a second material is formed by vapor phase epitaxy over the crystalline portion of first material. The second material has a crystalline portion and an amorphous portion. The amorphous portion of the second material is removed by abrasive planarization. A semiconductor structure formed by such a method includes the substrate, the first material, the second material, and optionally, an oxide material between the first material and the second material. The substrate, the first material, and the second material define a continuous crystalline structure. Semiconductor structures, memory devices, and systems are also disclosed.

18 Claims, 6 Drawing Sheets

(56) References Cited

U.S. PATENT DOCUMENTS

| | | |
|---|---|---|
| 2002/0066870 A1 | 6/2002 | Koba |
| 2006/0208257 A1 | 9/2006 | Branz et al. |
| 2007/0123062 A1* | 5/2007 | Kang ................. H01L 29/66795 |
| | | 438/795 |
| 2008/0057639 A1 | 3/2008 | Sandhu et al. |
| 2008/0153214 A1 | 6/2008 | Jung et al. |
| 2008/0182392 A1 | 7/2008 | Yeh et al. |
| 2009/0246460 A1 | 10/2009 | Cho et al. |
| 2010/0078729 A1 | 4/2010 | Fukutome et al. |
| 2013/0207226 A1 | 8/2013 | Adam et al. |
| 2014/0264348 A1* | 9/2014 | Tsai ..................... C30B 25/165 |
| | | 257/57 |
| 2015/0159295 A1 | 6/2015 | Takahashi et al. |
| 2015/0190785 A1 | 7/2015 | Mao et al. |
| 2018/0355213 A1* | 12/2018 | Park .................. H01L 21/28123 |

\* cited by examiner

METHODS OF FORMING SEMICONDUCTOR STRUCTURES

CROSS-REFERENCE TO RELATED APPLICATIONS

The subject matter of present application is related to the subject matter of U.S. patent application Ser. No. 16/121,966, filed Sep. 5, 2018, now U.S. Pat. No. 10,707,298, issued Jul. 7, 2020, for "Methods of Forming Semiconductor Structures," and U.S. patent application Ser. No. 16/122,004, filed Sep. 5, 2018, now U.S. Pat. No. 10,790,145, issued Sep. 29, 2020, for "Methods of Forming Crystallized Materials From Amrophous Materials," the disclosure of each of which is hereby incorporated herein in its entirety by this reference.

FIELD

Embodiments of the disclosure relate to the field of semiconductor device design and fabrication. More specifically, embodiments of the present disclosure relate to semiconductor structures comprising crystalline materials, memory devices, and electronic systems, and to methods of forming the semiconductor structures.

BACKGROUND

Crystalline silicon, crystalline germanium, or crystalline silicon-germanium (SiGe) are commonly used materials in transistors, such as in thin-film transistors. Vapor phase epitaxy (VPE) has been used to form the crystalline materials on a substrate at a temperature of greater than or equal to about 600° C. At these temperatures, however, thermally sensitive materials or components already formed on the semiconductor device may become damaged or otherwise compromised. At a lower temperature, the as-deposited material formed by VPE includes a crystalline portion on the substrate and an amorphous portion on the crystalline portion, with the amorphous portion negatively affecting electrical performance properties of the material. The relative amount of amorphous material that is formed increases with decreasing deposition temperatures. At relatively low temperatures, the as-deposited crystalline material cannot be formed by VPE at a thickness of greater than about 500 Å without forming an amorphous region.

Thin-film transistors may be used in various semiconductor devices, control logic assemblies, and control logic devices. Integration and miniaturization leads device designers to reduce the dimensions of the individual features and by reducing the separation distance between neighboring features. Therefore, it would be beneficial to produce design architectures that are not only compact, but offer performance advantages, as well as simplified designs.

DETAILED DESCRIPTION

Methods of forming a crystalline material on a base material are disclosed, as are semiconductor structures comprising the crystalline material and the base material. The crystalline material is present in the semiconductor structure at a total thickness of from about 200 Å to about 10 μm (about 100,000 Å) and is formed by a vapor phase epitaxy (VPE) process conducted at a low temperature. The crystalline material is formed by conducting successive formation acts and abrasive planarization acts until a desired thickness of the crystalline material is achieved. The crystalline material may be formed at a thickness of greater than about 500 Å, such as greater than about 1,000 Å. By forming the crystalline material at a low temperature, a semiconductor device containing the semiconductor structure may be fabricated at a low thermal budget.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, the term "about" in reference to a given parameter is inclusive of the stated value and has the meaning dictated by the context (e.g., it includes the degree of error associated with measurement of the given parameter).

Accordingly, a method of forming a semiconductor structure includes forming, by vapor phase epitaxy, a first material over a base material. The as-formed first material exhibits a crystalline portion and an amorphous portion. The amorphous portion of the first material is removed by abrasive planarization, such as chemical mechanical planarization (CMP). At least a second material is formed by vapor phase epitaxy over the crystalline portion of the first material. The at least a second material has a crystalline portion and an amorphous portion. The amorphous portion of the at least a second material is removed by chemical mechanical planarization. The formation acts and the abrasive planarization acts are conducted successively until a desired thickness of the crystalline material is achieved.

Figure 1:
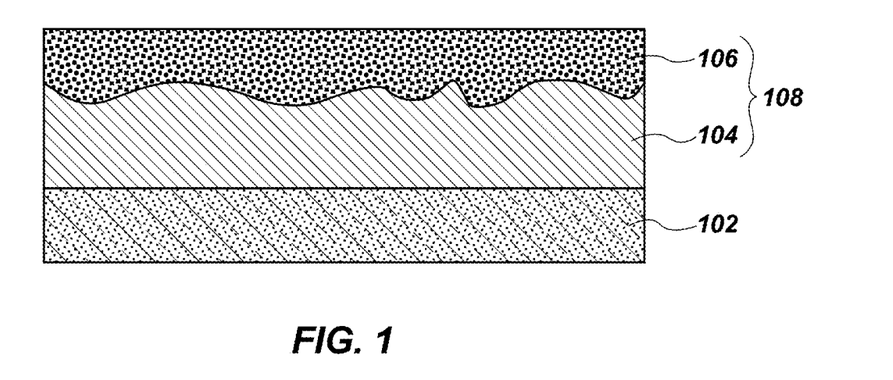
FIG. 1 is a simplified cross-sectional view illustrating a substrate over which a material has been applied in a method according to embodiments of the present disclosure.

FIG. 1 is a simplified cross-sectional view illustrating a base material 102 (e.g., a substrate) over which a material 108 is formed. The base material 102 may be or include Si, Ge, or Si and Ge in any ratio (i.e., $Si_{1-x}Ge_x$, where x is between 0 and 1). The base material 102 may be undoped or may be doped (e.g., including one or more dopants, such as arsenic, phosphorus, boron, etc., or combinations thereof). At least a portion of the base material 102 may be in a crystalline form or substantially all of the base material 102 may be in the crystalline form. While FIGS. 1-5 illustrate the base material 102 as being a single material, only a portion of the base material 102 may be in crystalline form. For instance, at least a surface (e.g., the top surface in the orientation shown in FIG. 1) of the base material 102 may be in the crystalline form. In some embodiments, the substrate 102 is crystalline silicon, such as polycrystalline silicon. In other embodiments, the substrate 102 is crystalline germanium. In yet other embodiments, the substrate 102 is crystalline silicon-germanium.

The material 108 as formed may include a crystalline portion and an amorphous portion. For instance, a first portion 104 of the material 108 exhibits a crystalline form that is substantially lattice-matched to the crystalline form of the base material 102, and the first portion 104 has a continuous crystalline structure with the base material 102. That is, as the material 108 is formed, some of the material 108 may exhibit the same crystalline structure as the portion of the base material 102 over which it is formed. The base material 102 may, thus, function as a template upon which the material 108 forms.

A second portion 106 of the material 108 may be amorphous as formed, and a boundary (e.g., interface) between the first portion 104 and the second portion 106 may be irregular when viewed by conventional microscopy techniques. In addition to being amorphous, the second portion 106 may exhibit a roughened surface, which is believed to prevent the formation of crystalline material thereof. The second portion 106 may remain after the material 108 has been formed, whereas the first portion 104 may be substantially covered by the second portion 106.

The material 108 may be formed on or over the base material 102 using one or more of a growth process and a deposition process. By way of non-limiting example, the material 108 may be formed on or over the base material 102 using vapor phase epitaxy (VPE), atomic layer epitaxy (ALE), pulsed atomic layer epitaxy (PALE), molecular beam epitaxy (MBE), gas source MBE, organometallic MBE, and chemical beam epitaxy (CBE). The process utilized to form the material 108 on or over the base material 102 may at least partially depend on the material properties of the material 108 and the base material 102, and may affect the number (e.g., density) of crystalline defects present in the material 108. The material 108 may be formed at a temperature (e.g., a deposition temperature) of less than about 600° C. or less than about 500° C., such as from about 400° C. to about 600° C., from about 400° C. to about 550° C., from about 450° C. to about 600° C., from about 400° C. to about 550° C., from about 450° C. to about 550° C., or from about 500° C. to about 600° C. The material 108 may differ in composition from the composition of the substrate 102. Alternatively, the material 108 and the substrate 102 may exhibit the same composition. The material 108 may be or include Si, Ge, or Si and Ge in any ratio (i.e., $Si_{1-x}Ge_x$).

The material 108 may be undoped or may include one or more dopants, such as arsenic, phosphorus, boron, etc., or combinations thereof.

To form the material 108, the base material 102 may be placed in a vacuum chamber and maintained at the deposition temperature (e.g., less than about 600° C., less than about 500° C., etc.). One or more gaseous precursors to the material 108 may be provided to the vacuum chamber, and may react at an exposed surface of the base material 102 to form the material 108 in a monolayer-by-monolayer manner. The material 108 as-formed includes the first portion 104 and the second portion 106 as described above.

Figure 2:
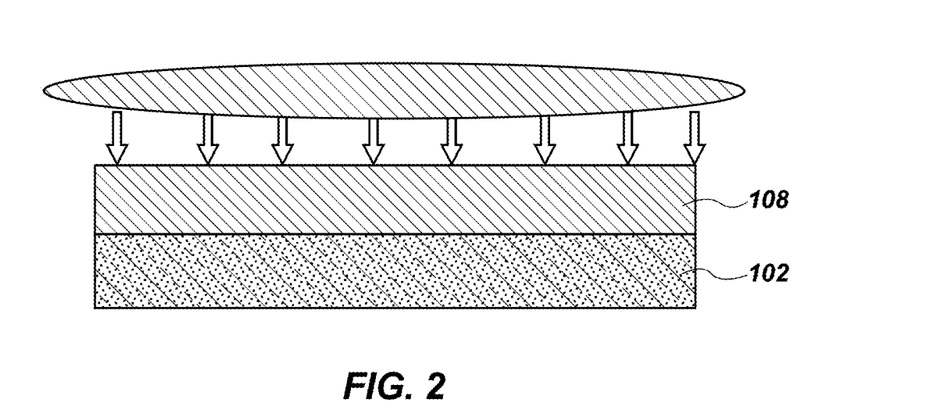
FIG. 2 is a simplified cross-sectional view illustrating the substrate of FIG. 1, in which a portion of the material has been removed according to embodiments of the present disclosure.

Since a crystalline form of the material 108 is desired over the substrate 102, the amorphous portion may be removed. Without being bound by any theory, the roughened surface of the second portion 106 of the material 108 is believed to affect the formation of additional crystalline material over the second portion 106. As shown in FIG. 2, the second portion 106 of the material 108 may be removed by, for example, chemical mechanical planarization (CMP). A slurry composition and abrasive used in the CMP process may be selected depending on the material 108 to be removed. Through the CMP process, the amorphous portion (i.e., the second portion 106) of the material 108 may be removed, while substantially all of the crystalline portion (i.e., the first portion 104) of the material 108 remains. The CMP process may be conducted for an amount of time, such as from 10 seconds to about 5 minutes, sufficient to remove substantially all of the second portion 106 without substantially removing the first portion 104. In other words, only a minimal amount of the first portion 104 may be removed by the CMP process. The first portion 104 of the material 108 remaining after the CMP process may be substantially crystalline. After the CMP process, an upper surface of the first portion 104 of the material 108 may be substantially planar. For example, the upper surface may have a surface roughness of less than about 50 Å RMS, less than about 10 Å RMS, or even less than about 5 Å RMS.

Figure 3:
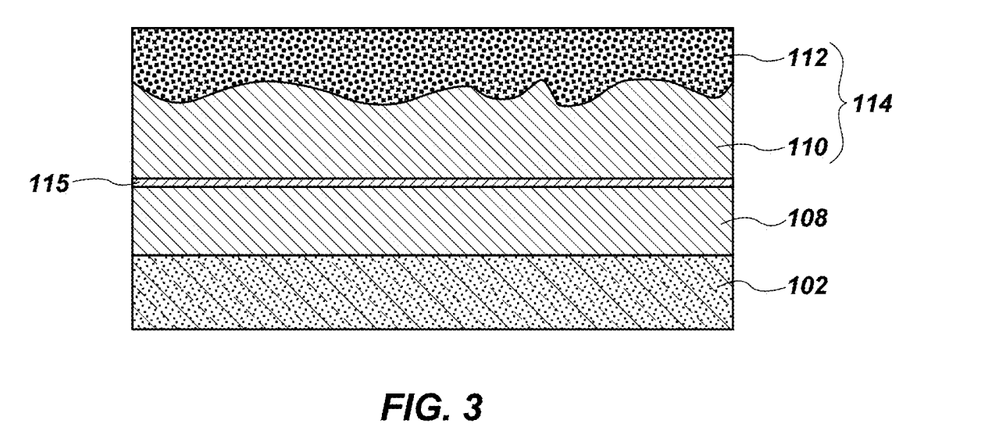
FIG. 3 is a simplified cross-sectional view illustrating the substrate of FIG. 2, over which a second material has been applied in a method according to embodiments of the present disclosure.

As shown in FIG. 3, another material 114 may be formed over the first portion 104 of the material 108 after the CMP process. Because the exposed surface of the first portion 104 of the material 108 is crystalline, a first portion 110 of the material 114 may be formed with the same crystalline structure as the first portion 104 of the material 108. The first portion 104 of the material 108 may function as a template upon which the material 114 is formed. A second portion 112 of the material 114 may be amorphous as formed, and the boundary between the first portion 110 and the second portion 112 may be irregular. The second portion 112 may remain exposed after the material 114 has been formed, whereas the first portion 110 may be substantially covered by the second portion 112. An oxide layer 115 may, optionally, be formed on the first portion 104 of the material 108 before the material 114 is provided thereon. The oxide layer 115 is not added intentionally, but may form incidentally in the process. It may be desirable to limit the thickness of the oxide layer 115, such that the crystalline structure of the first portion 104 of the material 108 may be transferred to the first portion 110 of the material 114. In some embodiments, a reducing gas may be provided to remove some or all of the oxide layer 115.

The material 114 may be of the same composition as the material 108 formed previously, and may be formed as described above. In some embodiments, the compositions of the material 108 and the material 114 may be different. For example, the material 114 may have a different ratio of Si:Ge than the material 108, may have a dopant, a different dopant, and/or a different amount of a dopant, etc.

Thus, in some embodiments, a semiconductor structure may include a first material over a base material at least a second material over the first material. The first material and the at least a second material each include at least one element selected from the group consisting of silicon and germanium. The first material and the at least a second material are crystalline. The base material, the first material, and the at least a second material define a continuous crystalline structure.

Figure 4:
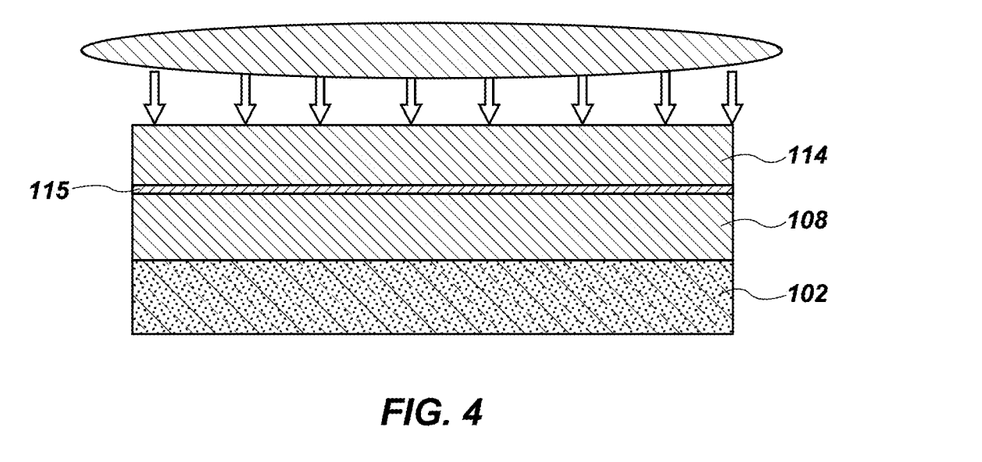
FIG. 4 is a simplified cross-sectional view illustrating the substrate of FIG. 3, in which a portion of the second material has been removed according to embodiments of the present disclosure.

As shown in FIG. 4, the second portion 112 of the material 114 may be removed by, for example, CMP. A slurry composition and abrasive used in the CMP process may be selected depending on the material 114 to be removed. Through the CMP process, the amorphous portion (i.e., the second portion 112) of the material 114 may be removed, while substantially all of the crystalline portion (i.e., the first portion 110) of the material 114 remains. The CMP process may be conducted for an amount of time, such as from 10 seconds to about 5 minutes, sufficient to remove substantially all of the second portion 112 without substantially removing the first portion 110. In other words, only a minimal amount of the first portion 110 may be removed by the CMP process. The first portion 110 of the material 114 remaining after the CMP process may be substantially crystalline. After the CMP process, an upper surface of the first portion 110 of the material 114 may be substantially planar. For example, the upper surface may have a surface roughness of less than about 50 Å RMS, less than about 10 Å RMS, or even less than about 5 Å RMS.

The formation of the crystalline portions of the materials 108, 114 and removal (e.g., CMP) of the amorphous portions of the materials may be repeated to achieve a crystalline material having a desired thickness. The total thickness of the crystalline material may range from about 200 Å to about 10 µm (about 100,000 Å), such as from about 200 Å to about 1,000 Å, from about 200 Å to about 2,000 Å, from about 300 Å to about 4,000 Å, or from about 200 Å to about 5,000 Å. Each formation and removal act may result in the formation of a crystalline portion at a thickness of from about 20 Å to about 5 µm (about 50,000 Å). In other words, each formation and removal act forms a substantially crystalline portion of the total thickness of the crystalline material. The total thickness of the crystalline material may be achieved by conducting multiple formation and removal acts until the desired thickness is achieved. The crystalline material may, thus, include multiple crystalline portions. Each crystalline portion may exhibit an interface with an overlying crystalline portion or underlying crystalline portion, with each interface being visually distinguishable. The interfaces may be viewed visually by conventional techniques, such as by scanning electron microscopy (SEM) or scanning transmission electron microscopy (STEM). Without being bound by any theory, the interfaces are believed to provide variable scattering of electrons, resulting in improved electrical properties of a semiconductor device (e.g., a transistor) containing the crystalline material. By way of example only, the semiconductor device may exhibit reduced leakage and improved $I_{off}$ by including multiple crystalline portions having a total thickness of greater than about 500 Å.

Figure 5:
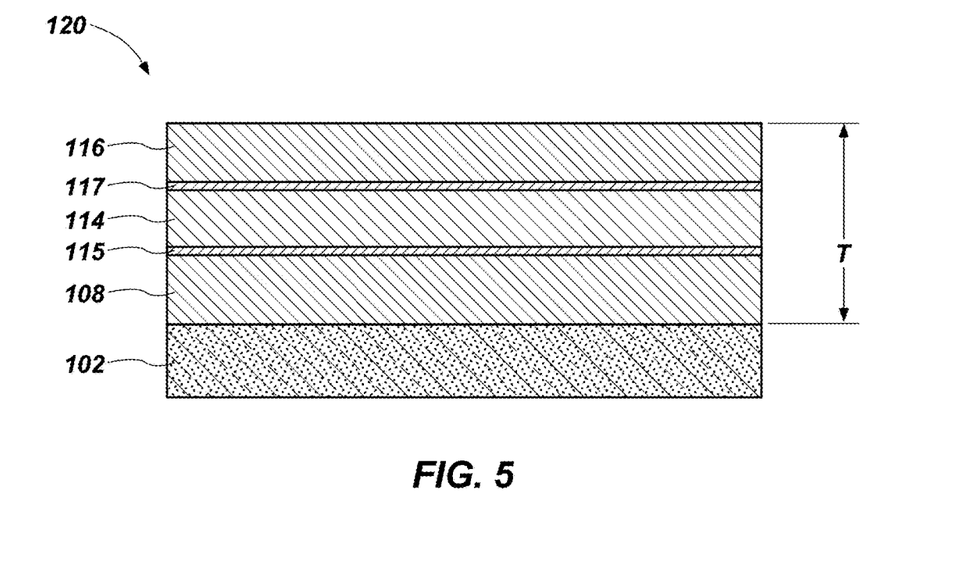
FIG. 5 is a simplified cross-sectional view illustrating the substrate of FIG. 4, over which a third material has been applied in a method according to embodiments of the present disclosure.

FIG. 5 illustrates a semiconductor structure 120 including the base material 102, the first portion 104 of the material 108, the optional oxide layer 115, the first portion 110 of the material 114, another optional oxide layer 117, and a first portion of another material 116. The material 116 may be formed in the same manner as the materials 108, 114, and may have the same or a different composition. As formed, the material 116 may include the first portion (e.g., a crystalline portion) and a second portion (not shown) (e.g., an amorphous portion), with the second portion removed as described above for the second portions 106, 112. While FIG. 5 illustrates a semiconductor structure 120 including three crystalline portions, the formation and CMP acts described above may be repeated until the desired thickness of the crystalline material is achieved.

The crystalline portions of the materials 108, 114, and 116 may have a total thickness T, which thickness T may be greater than materials can be conventionally formed entirely in crystalline form at, for example, a temperature of less than about 600° C. For example, the semiconductor structure 120 may have crystalline portions of the materials 108, 114, 116 having a thickness of at least about 500 Å, at least 1000 Å, or even at least about 1500 Å. Crystalline materials of such thicknesses may be difficult or impossible to produce reliably at temperatures that do not damage certain electronic components (e.g., temperatures of about 600° C. or less). The semiconductor structure 120 formed as described above may be substantially free of amorphous material.

The semiconductor structure 120 according to embodiments of the disclosure may be utilized as transistors (e.g., a vertical thin-film transistor (vertical TFT)) in a memory cell. The semiconductor structure 120 may be patterned by conventional techniques to form a transistor that includes a channel region, and a source region and a drain region coupled to the channel region. The semiconductor structure 120 exhibits a uniform crystalline structure and may be formed at a total thickness of the crystalline material of greater than about 500 Å.

Figure 6:
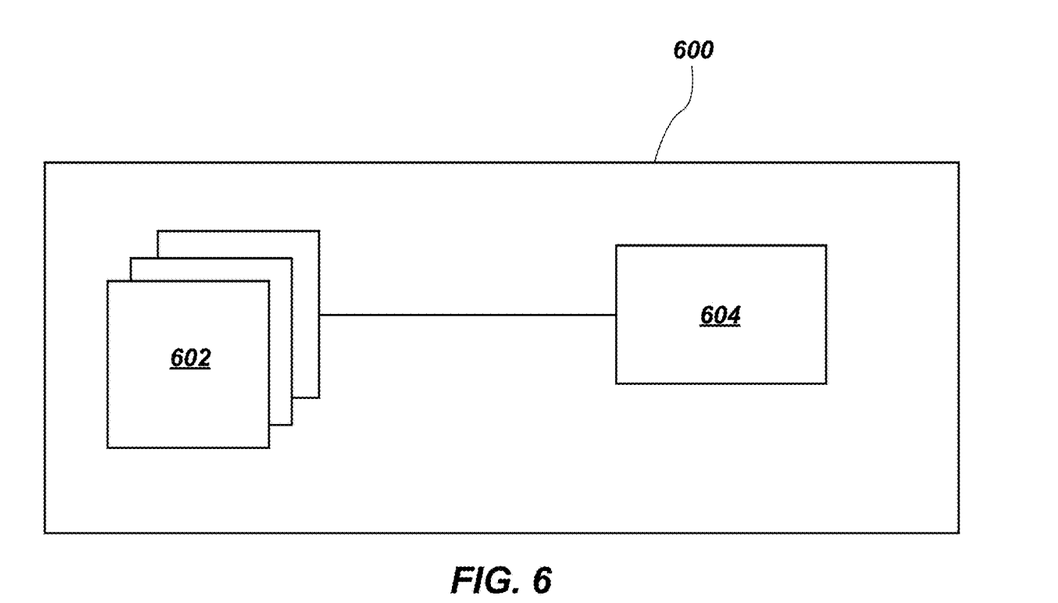
FIG. 6 is a functional block diagram of a memory device including a memory array comprising transistors in accordance with embodiments of embodiments of the disclosure.

FIG. 6 illustrates a simplified block diagram of a memory device 600 in accordance with embodiments of the disclosure. The memory device 600 includes at least one memory cell having at least one semiconductor structure 120 (FIG. 5) according to embodiments of the disclosure, as described above, in operative communication with a storage element. The semiconductor structure 120 may include a vertical TFT that acts as a switch for enabling and disabling current flow through the memory cell. The memory device 600 includes a memory array 602 comprising the memory cells and a control logic component 604. The memory array 602 may include multiple memory cells including the at least one semiconductor structure 120 according to embodiments of the disclosure. The control logic component 604 may be configured to operatively interact with the memory array 602 so as to read, write, or refresh any or all memory cells within the memory array 602. The memory device 600 including the semiconductor structure 120 may be formed by conducting additional process acts, which are not described in detail herein.

The semiconductor structure 120 (FIG. 5) or portions thereof may be incorporated in memory structures, memory cells, arrays including the memory cells, memory devices, switching devices, other semiconductor devices including the arrays, and systems including the arrays. Embodiments of the semiconductor structure 120 may be used in a variety of memory cells (e.g., volatile memory, non-volatile memory) and/or transistor configurations. Non-limiting examples include random-access memory (RAM), read-only memory (ROM), dynamic random-access memory (DRAM), synchronous dynamic random-access memory (SDRAM), flash memory, resistive random-access memory (ReRAM), conductive bridge random-access memory (conductive bridge RAM), magnetoresistive random-access memory (MRAM), phase change material (PCM) memory, phase change random-access memory (PCRAM), spin-torque-transfer random-access memory (STTRAM), oxygen vacancy-based memory, programmable conductor memory, ferroelectric random-access memory (FE-RAM), reference field-effect transistors (RE-FET), etc.

Accordingly, in some embodiments, a memory device as disclosed includes a semiconductor structure comprising a first material over a crystalline base material, and at least a second material over the first material. The first material and the at least a second material each comprise at least one element selected from the group consisting of silicon and germanium. The first material and the at least a second material are in crystalline form. The crystalline base material, the first material, and the at least a second material define a continuous crystalline structure.

Figure 7:
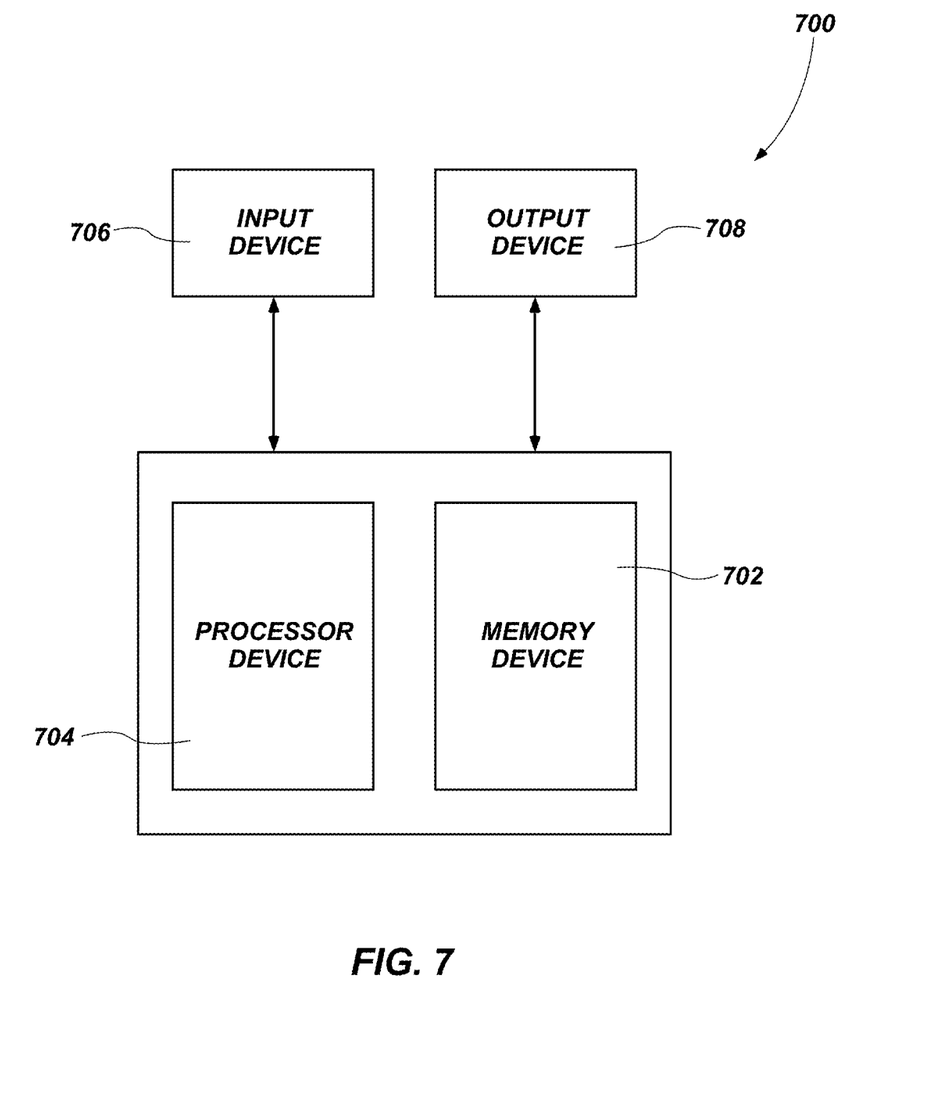
FIG. 7 is a schematic block diagram illustrating an electronic system including semiconductor devices comprising at least one transistor in accordance with embodiments of the disclosure.

The memory device 600 including the semiconductor structure 120 may be used in an electronic system 700 as shown in FIG. 7. The electronic system 700 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet such as, for example, an iPad® or SURFACE® tablet, an electronic book, a navigation device, etc. The electronic system 700 includes at least one memory device 702, which includes at least one semiconductor device including memory cells having at least one semiconductor structure (e.g., a vertical TFT) as previously described. The electronic system 700 may further include at least one electronic signal processor device 704 (often referred to as a "microprocessor"). The electronic signal processor device 704 may, optionally, include at least one semiconductor structure as previously described. The electronic system 700 may further include one or more input devices 706 for inputting information into the electronic system 700 by a user, such as, for example, a mouse or other pointing device, a keyboard, a touchpad, a button, or a control panel. The electronic system 700 may further include one or more output devices 708 for outputting information (e.g., visual or audio output) to a user such as, for example, a monitor, a display, a printer, an audio output jack, a speaker, etc. In some embodiments, the input device 706 and the output device 708 may comprise a single touchscreen device that can be used both to input information to the electronic system 700 and to output visual information to a user. The one or more input devices 706 and output devices 708 may communicate electrically with at least one of the memory device 702 and the electronic signal processor device 704.

Accordingly, a system is disclosed comprising memory including memory cells comprising at least one vertical thin film transistor and a processor in operative communication with at least one input device, at least one output device, and the memory. The at least one vertical thin-film transistor comprises a first material over a crystalline portion of a base material, and at least a second material over the first material. The first material and the at least a second material each comprise at least one element selected from the group consisting of silicon and germanium. The first material and the at least a second material are in crystalline form. The substrate, the first material, and the at least a second material define a continuous crystalline structure.

EXAMPLES

Example 1: Vapor Phase Epitaxy and Chemical Mechanical Planarization

A substrate of $Si_{0.2}Ge_{0.8}$, having a thickness of about 400 Å, was subjected to a vapor phase epitaxy process. The substrate was placed in a chamber, and silicon and germanium precursors were provided therein while the substrate was maintained at about 460° C. The silicon and germanium precursors formed SiGe, in a molar ratio of about 1 mole Si to 1 mole Ge, over the $Si_{0.2}Ge_{0.8}$ substrate at a thickness of about 550 Å.

A portion of the deposited SiGe was then removed with a CMP process to remove approximately 150 Å of the SiGe. The substrate was returned to the chamber, and another 550 Å of SiGe was formed. Some of this material was also removed with a CMP process to remove approximately 150 Å of the SiGe. The process was repeated one more time, resulting in a final thickness of the SiGe (excluding the $Si_{0.2}Ge_{0.8}$ substrate) of about 1,200 Å.

Figure 8:
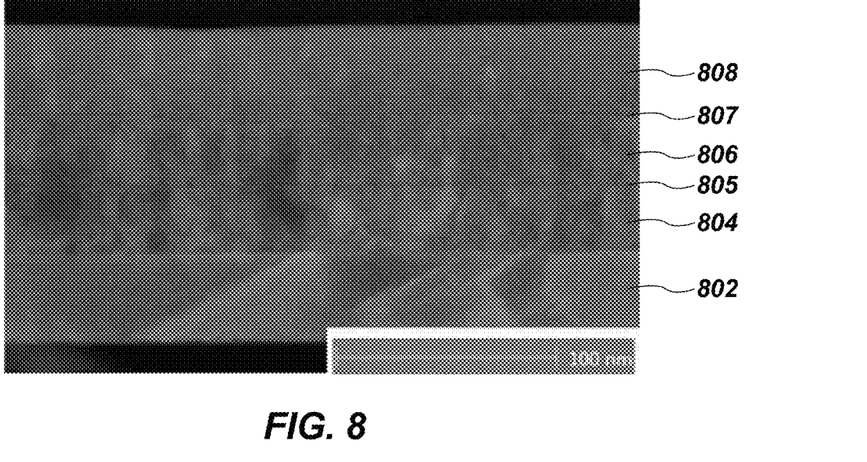
FIG. 8 is an image obtained via scanning transmission electron microscopy (STEM) of a cross-section of a wafer formed according to embodiments of the present disclosure.

FIG. 8 shows an image obtained via scanning transmission electron microscopy (STEM) of a cross-section of the wafer and SiGe material. The substrate 802 appears near the bottom of the image, with successive layers 804, 806, 808 of SiGe. Horizontal lines 805, 807 appear between the layers 804, 806, 808, which indicate the points at which each CMP was stopped (e.g., each of the amorphous materials was removed) and subsequent deposition was begun. Without being bound to any particular theory, the horizontal lines 805, 807 may constitute an interface with an oxide layer. However, the crystalline structure of the layers 804, 806, 808 appears to be continuous.

Comparative Example 2: Single-Step Vapor Phase Epitaxy

A substrate of $Si_{0.2}Ge_{0.8}$, having a thickness of about 400 Å, was subjected to a vapor phase epitaxy process. The substrate was placed in a chamber, and silicon and germanium precursors were provided therein while the substrate was maintained at about 460° C. The silicon and germanium precursors formed SiGe, in a molar ratio of about 1 mole Si to 1 mole Ge, over the substrate at a thickness of about 1,000 Å.

Figure 9:
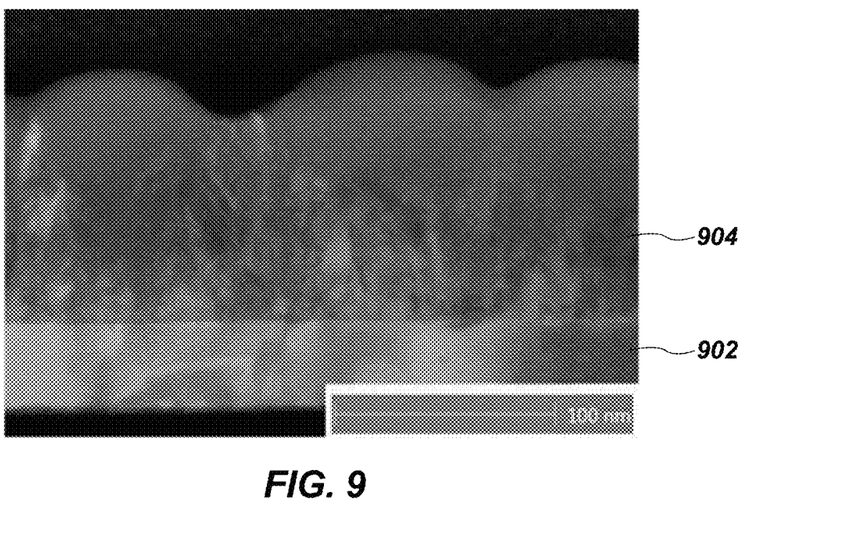
FIG. 9 is an image obtained via STEM of a cross-section of a wafer formed by conventional methods.

FIG. 9 shows an image obtained via STEM of a cross-section of the $Si_{0.2}Ge_{0.8}$ substrate and the SiGe material thereon. The $Si_{0.2}Ge_{0.8}$ substrate 902 appears near the bottom of the image, with the SiGe material 904 over the $Si_{0.2}Ge_{0.8}$ substrate 902. It appears that portions of the deposited SiGe material 904 are crystalline, but the upper uniformly colored portions of the SiGe material 904 are amorphous.

Comparative Example 3: Three-Step Vapor Phase Epitaxy

A substrate of $Si_{0.2}Ge_{0.8}$, having a thickness of about 400 Å, was subjected to a vapor phase epitaxy process. The substrate was placed in a chamber, and silicon and germanium precursors were provided therein while the wafer was maintained at about 460° C. The silicon and germanium precursors formed SiGe, in a molar ratio of about 1 mole Si to 1 mole Ge, over the substrate at a thickness of about 500 Å. The deposition process was repeated two more times without conducting CMP in between, resulting in a final thickness of the SiGe (excluding the wafer) of about 1,500 Å.

Figure 10:
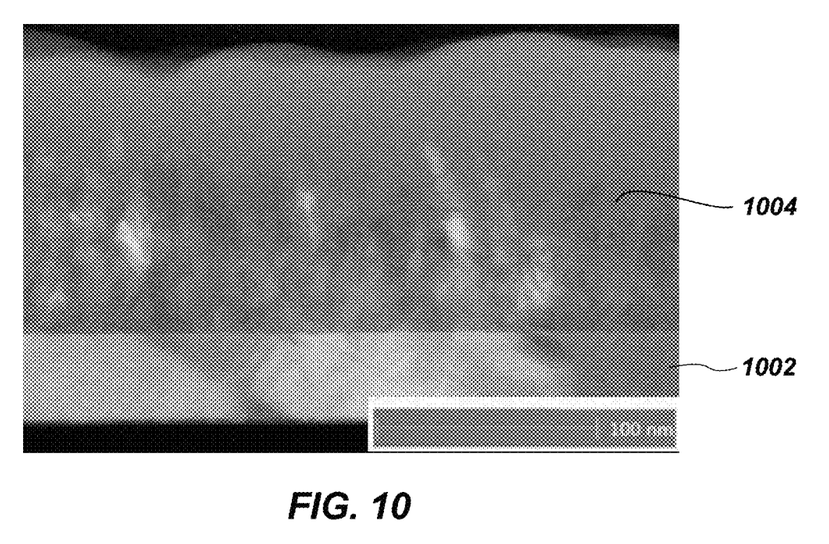
FIG. 10 is an image obtained via STEM of a cross-section of a wafer formed by conventional methods.

FIG. 10 shows an image obtained via STEM of a cross-section of the $Si_{0.2}Ge_{0.8}$ substrate and SiGe material. The substrate 1002 appears near the bottom of the image, with deposited SiGe material 1004 of SiGe over the substrate 1002. As shown in FIG. 10, the layers are not visibly distinct from one another. It appears that portions of the deposited SiGe material 1004 are crystalline, but the upper uniform-colored portions of the deposited SiGe material 1004 are amorphous.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method, comprising:
   forming, by vapor phase epitaxy, a first material over a substantially planar base material, the first material comprising a crystalline portion and an amorphous portion;
   removing, by abrasive planarization, the amorphous portion of the first material;
   forming, by vapor phase epitaxy, at least a second material over the crystalline portion of the first material, the at least a second material comprising a crystalline portion and an amorphous portion; and
   removing, by abrasive planarization, the amorphous portion of the at least a second material.

2. The method of claim 1, wherein the first material and the at least a second material exhibit a common chemical composition.

3. The method of claim 1, wherein forming the first material comprises forming the crystalline portion of the first material to exhibit a continuous crystalline structure with the base material.

4. The method of claim 1, wherein forming the at least a second material comprises forming the crystalline portion of the at least a second material to exhibit a continuous crystalline structure with the crystalline portion of the first material.

5. The method of claim 1, wherein forming at least a second material comprises forming a third material over the crystalline portion of the at least a second material, the third material comprising a crystalline portion and an amorphous portion, wherein the method further comprises:
   removing, by abrasive planarization, the amorphous portion of the third material.

6. The method of claim 1, wherein the method comprises forming a substantially continuous epitaxial material exhibiting a total thickness of at least about 500 Å over the base material.

7. The method of claim 6, wherein the method comprises forming a substantially continuous epitaxial material exhibiting a total thickness of at least about 1,000 Å over the base material.

8. The method of claim 1, wherein the method comprises forming an epitaxial material exhibiting a thickness of at least about 500 Å and substantially free of amorphous material over the base material.

9. The method of claim 1, wherein forming a first material and forming at least a second material comprises maintaining the base material at a temperature of less than about 600° C. while forming the first and second materials.

10. The method of claim 9, wherein forming a first material and forming at least a second material comprises maintaining the base material at a temperature of less than about 500° C. while forming the first and second materials.

11. The method of claim 1, wherein forming a first material and forming at least a second material each comprise forming a material selected from the group consisting of Si, Ge, and SiGe over the base material.

12. The method of claim 1, wherein forming a first material over the base material comprises forming the first material over the base material comprising a material selected from the group consisting of Si, Ge, and SiGe.

13. The method of claim 1, wherein forming, by vapor phase epitaxy, a first material over a base material and forming, by vapor phase epitaxy, at least a second material comprises forming at least one of the first material and the at least a second material comprising a dopant.

14. The method of claim 13, wherein the dopant comprises an element selected from the group consisting of boron, arsenic, and phosphorus.

15. The method of claim 1, wherein forming, by vapor phase epitaxy, a first material over a base material comprises forming the first material over the base material comprising a dopant selected from the group consisting of boron, arsenic, and phosphorous.

16. The method of claim 1, further comprising forming an oxide material between the first material and the at least a second material.

17. A method, comprising:
   forming a first material comprising a crystalline portion and an amorphous portion over a substantially planar base material comprising a crystalline portion;
   removing, by abrasive planarization, the amorphous portion of the first material;
   forming, by vapor phase epitaxy, at least a second material over the crystalline portion of the first material, the at least a second material comprising a crystalline portion and an amorphous portion; and
   removing, by abrasive planarization, the amorphous portion of the at least a second material to form a continuous crystalline structure comprising the first material and the second material, the first material and the second material comprising the same crystalline structure as the portion of the base material.

18. A method, comprising:
   forming, at a temperature of less than about 600° C., by vapor phase epitaxy, a first material over a base material, the first material comprising a crystalline portion and an amorphous portion;
   removing, by abrasive planarization, the amorphous portion of the first material;
   forming, at a temperature of less than about 600° C., by vapor phase epitaxy, at least a second material over the crystalline portion of the first material, the at least a second material comprising a crystalline portion and an amorphous portion; and
   removing, by abrasive planarization, the amorphous portion of the at least a second material.

* * * * *

UNITED STATES PATENT AND TRADEMARK OFFICE
CERTIFICATE OF CORRECTION

PATENT NO. : 11,018,229 B2  
APPLICATION NO. : 16/121928  
DATED : May 25, 2021  
INVENTOR(S) : Michael Mutch and Manuj Nahar Page 1 of 1

It is certified that error appears in the above-identified patent and that said Letters Patent is hereby corrected as shown below:

In the Specification

Column 1, Line 13, change "Amrophous" to --Amorphous--

Signed and Sealed this  
Sixth Day of July, 2021

Drew Hirshfeld  
*Performing the Functions and Duties of the*  
*Under Secretary of Commerce for Intellectual Property and*  
*Director of the United States Patent and Trademark Office*